(12) United States Patent
Gardner et al.

(10) Patent No.: US 6,355,955 B1
(45) Date of Patent: Mar. 12, 2002

(54) TRANSISTOR AND A METHOD FOR FORMING THE TRANSISTOR WITH ELEVATED AND/OR RELATIVELY SHALLOW SOURCE/DRAIN REGIONS TO ACHIEVE ENHANCED GATE ELECTRODE FORMATION

(75) Inventors: Mark I. Gardner, Cedar Creek; H. Jim Fulford; Daniel Kadosh, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/503,979

(22) Filed: Feb. 14, 2000

Related U.S. Application Data (62) Division of application No. 09/078,828, filed on May 14, 1998, now abandoned.

(51) Int. Cl.⁷ .................. H01L 29/76; H01L 29/94; H01L 31/062; H01L 31/113; H01L 31/119
(52) U.S. Cl. ........................... 257/330; 257/408
(58) Field of Search ................. 257/330–335, 257/408, 283; 438/300–305

(56) References Cited

U.S. PATENT DOCUMENTS

| | | | |
|---|---|---|---|
| 4,899,202 A | | 2/1990 | Blake et al. |
| 5,060,035 A | | 10/1991 | Nishimura et al. |
| 5,331,197 A | | 7/1994 | Miyawaki et al. |
| 5,448,094 A | * | 9/1995 | Hsu .................. 257/330 |
| 5,453,635 A | * | 9/1995 | Hsu et al. ........... 257/336 |
| 5,567,966 A | * | 10/1996 | Hwang .............. 257/408 |
| 5,583,064 A | * | 12/1996 | Lee et al. ............ 438/300 |
| 5,817,560 A | * | 10/1998 | Gardner et al. ..... 438/301 |
| 5,998,288 A | * | 12/1999 | Gardner et al. ..... 438/589 |

FOREIGN PATENT DOCUMENTS

JP    4-215479    8/1992

\* cited by examiner

*Primary Examiner*—Sara Crane
*Assistant Examiner*—Thien F Tran
(74) *Attorney, Agent, or Firm*—Kevin L. Daffer; Conley, Rose & Tayon P.C.

(57) ABSTRACT

An integrated circuit fabrication process is provided for forming a transistor having shallow effective source/drain regions and/or laterally shortened source/drain regions. In one embodiment a mesa is formed from the semiconductor substrate. The mesa preferably extends from an upper surface of the semiconductor substrate. A gate conductor is preferably formed on a dielectric layer which is formed on an upper surface of the mesa. LDD areas and source/drain regions are formed such that the regions are substantially contained within the mesa. In another embodiment, a gate conductor material is deposited within a trench, the trench being lined with a gate dielectric material, formed in a semiconductor substrate. The deposited gate conductor material is etched to form a gate conductor in which a lower surface of the gate conductor is substantially below an upper surface of the silicon substrate. Source/drain regions are formed within the semiconductor substrate such that the effective depth of the formed source/drain regions is minimized.

8 Claims, 7 Drawing Sheets

TRANSISTOR AND A METHOD FOR FORMING THE TRANSISTOR WITH ELEVATED AND/OR RELATIVELY SHALLOW SOURCE/DRAIN REGIONS TO ACHIEVE ENHANCED GATE ELECTRODE FORMATION

This is a Division of application Ser. No. 09/078,828, filed May 14, 1998 now abandoned.

BACKGROUND OF THE INVENTION

1. Field of the Invention

This invention relates to semiconductor fabrication and more particularly to a high performance MOSFET with laterally reduced and/or relatively shallow source/drain regions.

2. Description of the Relevant Art

Fabrication of a MOSFET device is well known. Generally speaking, MOSFETs are manufactured by placing an undoped polycrystalline silicon ("polysilicon") material over a relatively thin gate oxide. The polysilicon material and the gate oxide are then patterned to form a gate conductor with source/drain regions adjacent to and on opposite sides of the gate conductor. The gate conductor and source/drain regions are then implanted with an impurity dopant species. If the impurity dopant species used for forming the source/drain regions is n-type, then the resulting MOSFET is an NMOSFET ("n-channel") transistor device. Conversely, if the source/drain dopant species is p-type, then the resulting MOSFET is a PMOSFET ("p-channel") transistor device. Integrated circuits utilize either n-channel devices exclusively, p-channel devices exclusively, or a combination of both on a single substrate. While both types of devices can be formed, the devices are distinguishable based on the dopant species used.

The operating characteristics of a MOSFET device are a function of the transistor's dimensions. In particular, the drain current ($I_{ds}$) is proportional to the ratio of the transistor's channel width (W) to the transistor's channel length (L) over a wide range of operating conditions. For a given transistor width and a given biasing condition (e.g., $V_G$=3V, $V_D$=3V, and $V_S$=0V), $I_{ds}$ is maximized by minimizing the transistor's channel length L. Minimizing channel length also improves the speed of integrated circuits which include a large number of individual transistors, since the larger drain currents characteristic of short channel devices may quickly drive the adjoining transistors into saturation. Minimizing L is, therefore, desirable from a device operation standpoint. In addition, minimizing the transistor length is desirable because a smaller area of silicon is required to manufacture a transistor having a smaller length. By minimizing the area required for a given transistor, the number of transistors available for a given area of silicon increases, and with it, a corresponding increase in the circuit complexity that can be achieved on the given area of silicon. Moreover, smaller transistors result in smaller die sizes. Smaller die sizes are desirable from a manufacturing perspective because they increase the number of devices that can be fabricated on a single silicon wafer and decrease the probability that any individual die is rendered inoperable during the fabrication process by randomly occurring defects that are caused by contaminating particles present in every fabrication facility.

As transistor length decreases below approximately 1.0 $\mu$m, for example, a problem known as short channel effects becomes predominant. Generally speaking, short channel effects impact device operation by, inter alia, reducing device threshold voltages and increasing sub-threshold currents. As transistor length becomes small enough, the depletion regions associated with the junction areas may extend toward one another and substantially occupy the channel area. Hence, some of the channel will be partially depleted without any influence of gate voltage. Even at times when the gate voltage is below the threshold amount, current between the junctions (often referred to as subthreshold current) nonetheless exists for transistors having a relatively short transistor length.

A problem related to short channel effects, and the sub-threshold currents associated therewith, is the problem of hot-carrier effects. Hot carrier effects are a phenomenon by which hot-carriers (i.e., holes and electrons) arrive at or near an electric field gradient. The electric field gradient, often referred to as the maximum electric field ("Em"), occurs near the drain during saturated operation. More specifically, the electric field is predominant at the lateral junction of the drain adjacent to the channel. The electric field at the drain causes primarily electrons in the channel to gain kinetic energy and become "hot". These hot electrons traveling to the drain lose their energy by a process called impact ionization. Impact ionization serves to generate electron-hole pairs, wherein the pairs migrate to and become injected within the gate dielectric near the drain junction. Traps within the gate dielectric generally become electron traps, even if they are partially filled with holes. As a result, there is a net negative charge density in the gate dielectric. The trapped charge accumulates with time, resulting in a positive threshold shift in the NMOS transistor, or a negative threshold shift in a PMOS transistor. It is known that since hot electrons are more mobile than hot holes, hot carrier effects cause a greater threshold skew in NMOS transistors than PMOS transistors. Nonetheless, a PMOS transistor will undergo negative threshold skew if its transistor gate length is less than, e.g., 0.8 $\mu$m.

Unless modifications are made to the process in which relatively small transistors are formed, problems with sub-threshold current and threshold shift resulting from short channel effects and hot carrier effects will remain. To overcome these problems, alternative drain structures such as double-diffused drains ("DDD") and lightly doped drains ("LDD") must be used. The purpose of both types of structures is the same: to absorb some of the potential into the drain and thus reduce Em. The popularity of DDD structures has given way to LDD structures, since DDD structures cause unacceptably deep junctions and deleterious junction capacitance.

A conventional LDD structure is one whereby a light concentration of impurity is self-aligned to the edge of the gate conductor. The light impurity concentration is then followed by a heavier impurity concentration which is self-aligned to a spacer formed on the sidewalls of the gate conductor. The purpose of the first implant dose is to produce a lightly doped section of both the source and drain junction areas at the gate edge near the channel. The second implant dose is spaced from the channel a distance dictated by the thickness of the sidewall spacer. Resulting from the first and second implants, an impurity gradient occurs across the junction from the source/drain area of the junction to the LDD area adjacent the channel.

The distance between the source and drain regions of a transistor is often referred to as the physical channel length. However, after implantation of dopant species into the source and drain regions and subsequent diffusion of the dopant species, the actual distance between the source and drain regions become less than the physical channel length, and is often referred to as the effective channel length ("Leff"). In VLSI designs, as the physical channel length becomes small, so too must the Leff. Decreasing the Leff of a transistor generally leads to an increase in short-channel effects in which the transistor's properties, e.g., the transistor threshold voltage, undesirably vary from their design specification. Absent a comparable reduction in the depth of the source and drain junctions, the severity of the short channel effects resulting from a decrease in Leff may be profound. Accordingly, it has become necessary to scale down the vertical dimensions of the source and drain regions (i.e., the depth of the source/drain implant) to ensure proper operation of transistor devices.

The formation of shallow source and drain regions (i.e., junctions) is, however, rather difficult for PMOSFET devices which include boron-implanted junctions. Due to the relatively high diffusivity and channeling of boron atoms, implanted boron can penetrate deeply into the substrate. While using very low implant energies of boron might produce relatively shallow junctions, advances in technology are required to make available low-energy ion implanters before such low implant energies can be realized. Further, while reducing the junction depth provides protection against short channel effects, it also gives rise to increased resistivity of the source and drain junctions, adversely impacting the device operation. As a result of the increased resistivity, the saturation drive current and the overall speed of the transistor may drop. Moreover, forming contacts to relatively shallow junctions has several drawbacks. A contact layer which consumes the underlying source and drain junctions is often used during contact formation. For example, a refractory metal may be deposited across the source and drain junctions and heated to promote a reaction between the metal and the underlying silicon, thereby forming a low resistivity self-aligned silicide (i.e., salicide) upon the junctions. The silicide may completely consume the shallow junctions, penetrating into the substrate underneath the junctions, a phenomenon known as "junction spiking". Consequently, the junctions may exhibit large current leakage or become electrically shorted. Therefore, precautions must be taken to prevent excessive consumption, and hence junction spiking, of the shallow junctions during contact formation.

It is therefore desirable to develop a method for forming a transistor with relatively shallow effective source/drain junctions. Such a transistor would be less likely to experience short channel effects even if the channel possesses a relatively short physical channel length.

Additionally, further shrinking of the transistor gate length tends to make LDD and source/drain regions of a conventional transistor less effective. For example, shorter channel lengths typically require the source/drain length to also be reduced to minimize short channel effects. It is therefore further desirable to develop a method for forming a transistor which has reduced LDD and source/drain regions. Such a transistor may experience reduced short channel effects even if the channel possesses a relatively short physical channel length. Further, by minimizing the length of the LDD and source/drain regions, the number of transistors available for a given area of silicon may be increased, and with it, a corresponding increase in the circuit complexity that can be achieved on the given area of silicon.

SUMMARY OF THE INVENTION

The problems outlined above are in large part solved by the techniques hereof for forming a transistor having shallow effective source drain regions and/or laterally shortened source/drain regions.

In one embodiment, a semiconductor substrate, which includes a gate dielectric layer, a gate conductor layer, and a masking layer is provided. The masking layer is preferably patterned using optical lithography techniques such that photoresist material adjacent to the gate conductor region may be removed. Selective removal of the photoresist material preferably exposes portions of the polysilicon layer adjacent to the gate conductor. The formed masking structure preferably serves to mask etch access to the portions of the gate conductor layer which will later become the gate conductor of a transistor.

Portions of the gate conductor layer, the gate dielectric layer, and the silicon substrate, which are adjacent to the masking structure, are preferably removed. The gate conductor layer, the gate dielectric layer, and the silicon substrate may be removed using a single etching step or multiple etching steps. Etching of the silicon substrate forms a mesa which preferably extends above the silicon substrate. Etching is continued such that a distance between an upper surface of the mesa and an upper surface of the semiconductor substrate is preferably greater than a depth of a subsequently implanted source/drain region. By forming the mesa in this manner, the mesa is preferably made from the same material used for the semiconductor substrate. Preferably, both the semiconductor substrate and the silicon mesa are composed of single crystalline silicon.

Subsequent to forming the mesa, the lateral width of the masking structure is preferably reduced by an isotropic etch. The etch is preferably terminated after a select lateral amount of the masking structure is removed. The reduced width masking structure may then be used as a mask to further reduce the width of the gate conductor. The gate conductor is preferably etched by an anisotropic etch process down to the gate dielectric. As a result of this etching process, the lateral width of the gate conductor is reduced. The reduction of the lateral width of the gate conductor allows the formation of a transistor having a gate conductor, and therefore a channel length, which is less than the optical resolution of the photolithographic equipment. An advantage of this process is that the density of transistors in an integrated circuit may be increased by using these reduced width transistors.

The implantation of a first dopant distribution preferably forms LDD areas within the elevated mesa, adjacent to the gate conductor. The LDD areas are preferably aligned with the sidewalls of gate conductor and extend to the lateral boundary of the mesa. In this manner, the length of the LDD area may be controlled without the use of further masking steps or isolation structures. The control of the length of the LDD areas may help to reduce short channel effects.

After removal of the masking structure, a spacer material is preferably deposited across the entire semiconductor topography to form a conformal layer. The spacer material may be composed of silicon oxide, nitride, or oxynitride deposited from a CVD apparatus. After deposition, the spacer material preferably undergoes an anisotropic etch such that spacers are formed on the sidewalls of the gate conductor.

After formation of the spacers, source/drain regions are preferably formed in the mesa. The gate conductor and the spacers preferably serve to mask the source/drain implant from the channel region and the portion of the LDD areas under the spacers. The source/drain implant is preferably of the same dopant species as the LDD implant, albeit at a higher concentration and energy than the LDD implants. The spacers preferably serve to align the source/drain regions a spaced distance from the gate conductor. The source/drain regions preferably extend to a sidewall of mesa. In this manner, source/drain regions are formed which are substantially contained within the mesa.

After formation of the source/drain regions, a dielectric layer may be formed over the semiconductor substrate. The dielectric layer may be deposited from a CVD apparatus. The upper surface of the dielectric layer is preferably planarized (e.g., polished) such that a substantially planar dielectric layer is produced. The formed dielectric layer may serve to isolate transistors from each other. Thus, a series of transistors may be formed and isolated from each other without the use of standard isolation techniques (e.g., LOCOS or trench isolation).

In another embodiment, a trench is preferably formed by etching entirely through a masking layer formed upon a silicon-based substrate and partially through the substrate. A plasma etch technique may be employed to ensure that the lateral boundaries of the masking layer and the sidewalls of the trench are substantially vertical. A gate dielectric is formed upon the base and a portion of the sidewalls of the trench. The gate dielectric may, e.g., comprise thermally grown silicon dioxide. The masking layer may be a material through which ambient oxygen cannot significantly migrate. For example, the masking layer may be composed of silicon nitride arranged upon a pad oxide layer. The presence of such a masking layer upon the horizontal uppermost surface of the substrate may substantially inhibit the underlying silicon-based surface from being oxidized during the formation of the gate dielectric.

A dielectric layer (e.g., oxide) may be deposited by chemical-vapor deposition ("CVD") across the masking layer and the gate dielectric such that a pair of dielectric sidewall spacers are formed laterally adjacent to sidewalls of the masking layer. Subsequently, a gate conductor material (e.g., polysilicon) may be deposited into the trench across the dielectric layer to a level spaced above the upper surface of the masking layer. Thereafter, the gate conductor material and the dielectric layer are preferably removed from above the masking layer such that the upper surface of the gate conductor material is substantially coplanar with the upper surface of the masking layer. The portion of the gate conductor material retained between the dielectric sidewall spacers serves as the gate conductor for an ensuing transistor.

The sidewall spacers may then be selectively etched to a level approximately commensurate with the lower surface of the gate conductor. In this manner, the opposed lateral boundaries of the masking layer and the opposed sidewall surfaces of the gate conductor are preferably exposed. The distance between a lower surface of the gate conductor and an upper surface of the semiconductor substrate may now be adjusted by etching the semiconductor substrate. Reduction of this distance serves to reduce the depth of the subsequently formed source/drain regions.

An LDD implant which is self-aligned to those exposed lateral boundaries of the masking layer and sidewall surfaces of the gate conductor may then be performed. Absent the pre-existing sidewall spacers, the LDD dopant species are preferably permitted to pass into the substrate to form LDD areas without using a high implant energy. The lateral width of each LDD area is preferably dictated by the lateral thickness of the sidewall spacer previously arranged directly above that LDD area. The dielectric layer may be thus conformally deposited across the relatively short lateral boundaries of the masking layer to form sidewall spacers of substantially uniform lateral thickness. The lateral edges of the sidewall spacers are thus parallel to the vertically rising lateral boundaries of the masking layer. The vertical orientation of the boundaries of the masking layer and the sidewall surfaces of the gate conductor preferably allow the size of the LDD areas to be dictated primarily by the thickness of the sidewall spacers interposed between the two surfaces.

Subsequent to performing the LDD implant, the masking layer is preferably removed from the substrate surface. A spacer layer composed of a dielectric, e.g., oxide, nitride, or silicon oxynitride, is then deposited upon over the semiconductor substrate. An anisotropic etch is preferably performed to remove portions of the dielectric layer on the horizontal surfaces of the substrate. The anisotropic etch permits relatively thin sidewall spacers to be formed adjacent to the gate conductor sidewalls. A source/drain implant which is self-aligned to exposed lateral edges of the spacers is forwarded into the substrate to a depth spaced below the base of the trench to form source and drain regions laterally adjacent to the LDD areas. The dielectric residing upon the upper surface of the gate conductor may then be removed using, e.g., an anisotropic etch. Self-aligned metal silicide (i.e., salicide) structures may be formed upon the source and drain regions and the upper surface of the gate conductor by heating a refractory metal deposited across the topography, thereby causing silicon to react with the metal. The presence of the dielectric sidewall structures may prevent the refractory metal from contacting and reacting with the polysilicon sidewall surfaces of the gate conductor. Thus, silicide shorting between the gate conductor and the source and drain regions may be less likely to occur.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

Figure 1:
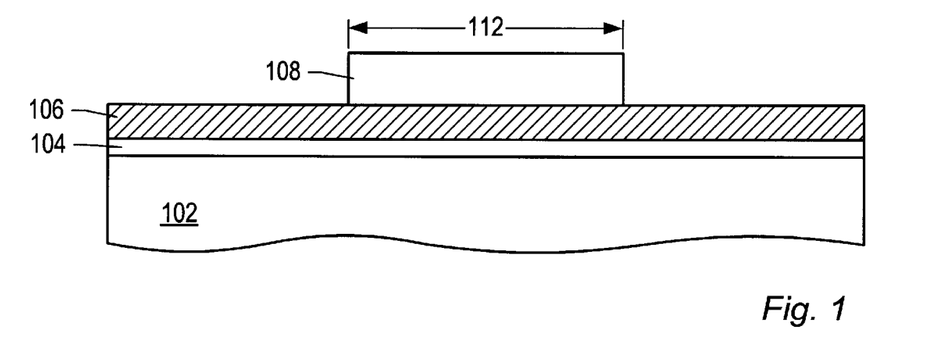
FIG. 1 is a partial cross-sectional view of a semiconductor substrate upon which a gate dielectric layer, a gate conductor layer, and a masking structure are formed.

FIGS. 1–9 illustrate a sequence of semiconductor fabrication steps according to one embodiment. Turning to FIG. 1, a partial cross sectional view of a semiconductor substrate 102 is depicted. Substrate 102 preferably comprises single crystalline silicon which has been slightly doped with n-type or p-type impurities. In an alternate embodiment, p-type or n-type wells may be arranged within select regions of substrate 102 to allow for the formation of a CMOS integrated circuit which includes both NMOSFET and PMOSFET transistors.

A gate dielectric layer 104 is preferably formed across semiconductor substrate 102. The gate dielectric layer 104 is either deposited or grown from a heated oxygen-bearing source. Gate dielectric 104 is preferably formed in a thermal oxidation furnace using temperatures of approximately 700° to 900° C. for a relatively short time (e.g., less than 60 minutes). It is preferred that gate dielectric 104 be grown to a thickness of approximately 15–40 angstroms.

Deposited upon the gate dielectric layer 104 is a gate conductor layer 106. Gate conductor layer 106 is preferably composed of polysilicon, and thus may be deposited using a chemical vapor deposition process (e.g., a plasma enhanced chemical vapor deposition ("PECVD") process from a silane source). The polysilicon gate conductor layer may be rendered conductive by implanting impurities into the polysilicon during later processing steps. The polysilicon layer 106 is preferably deposited to a thickness of approximately 1000 to 1500 angstroms. The upper surface of polysilicon layer 126 may then be polished to substantially reduce its surface roughness. This polishing may be accomplished by mechanical polishing, chemical-mechanical polishing, or sacrificial etchback. As a result, the thickness of polysilicon layer 126 may be reduced by about 50 angstroms to a uniform thickness across the dielectric surface.

A masking layer is preferably deposited upon gate conductor layer 106. Preferably, the masking layer is composed of photoresist material. The photoresist masking layer is preferably patterned using optical lithography techniques such that photoresist material adjacent to gate conductor region 112 may be removed to form masking structure 108. Selective removal of the photoresist material preferably exposes portions of gate conductor layer 106 adjacent to masking structure 108, as depicted in FIG. 1. The formed masking structure 108 serves to mask etch access to the portions of gate conductor layer 106 which will later become the gate conductor of a transistor.

Figure 2:
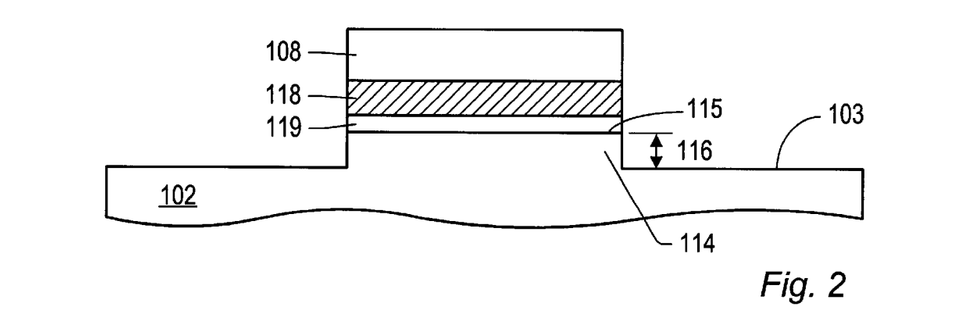
FIG. 2 is a processing step subsequent to FIG. 1, in which portions of the gate conductor layer, the gate dielectric layer, and the semiconductor substrate are removed such that a mesa is formed extending above the silicon substrate.

As depicted in FIG. 2, portions of gate conductor layer 106, gate dielectric layer 104, and silicon substrate 102 which are adjacent to masking structure 108 are preferably removed. The portions of gate conductor layer 106, gate dielectric layer 104, and silicon substrate 102 may be removed using a single etching step. The etching conditions are preferably chosen such that little selectivity between silicon and silicon dioxide etch rates exists. Either a dry, plasma etch or a wet, chemical etch may be used. Masking structure 108 is preferably substantially resistant to attack by the etchants, and thus protects underlying material from being etched.

Alternatively, etching of gate conductor layer 106, gate dielectric layer 104, and silicon substrate 102 may be accomplished in a sequential manner. A first etching process may be used to remove the exposed portions of gate conductor layer 106. The removal of the exposed portions of gate conductor layer 106 forms a gate conductor 118 on the upper surface of gate dielectric layer 104. Additionally, the removal of portions of gate conductor layer 106 preferably exposes portions of gate dielectric layer 104. A second etching process is preferably used to remove the exposed portions of gate dielectric layer 104. Together, masking structure 108 and gate conductor 118 protect the underlying portion of gate dielectric layer 104 from being etched. The removal of the exposed portions of gate dielectric layer 104 forms a gate dielectric 119 on the upper surface of semiconductor substrate 102. Additionally, removal of the exposed portions of gate dielectric layer 104 preferably exposes portions of silicon substrate 102. A third etching process is preferably used to remove portions of silicon substrate 102 which have been exposed by the prior two etching steps. Etching of silicon substrate 102 forms a mesa 114 which extends above the silicon substrate. Etching is continued such that a distance 116 between an upper surface 115 of the silicon mesa and an upper surface 103 of the semiconductor substrate is preferably greater than a depth of a subsequently implanted source/drain region. Each of the etching steps may be performed using either dry etching (e.g., a plasma etch), wet etching, or a combination of both techniques. The use of dry etching techniques is preferred since undercutting of the previously etched layers may occur during a wet etch process.

The formation of mesa 114 in this manner produces a mesa which is preferably made from the same material used for the semiconductor substrate. Preferably, both the semiconductor substrate and the silicon mesa are composed of single crystalline silicon. By etching the semiconductor substrate surrounding the gate conductor, the formed mesa 114 is preferably composed of a portion of the semiconductor substrate, rather than a separately formed silicon layer. The formed single crystalline mesa is therefore relatively free of defects which may be otherwise present if, e.g., an epitaxial silicon mesa were to be used instead.

Figure 3:
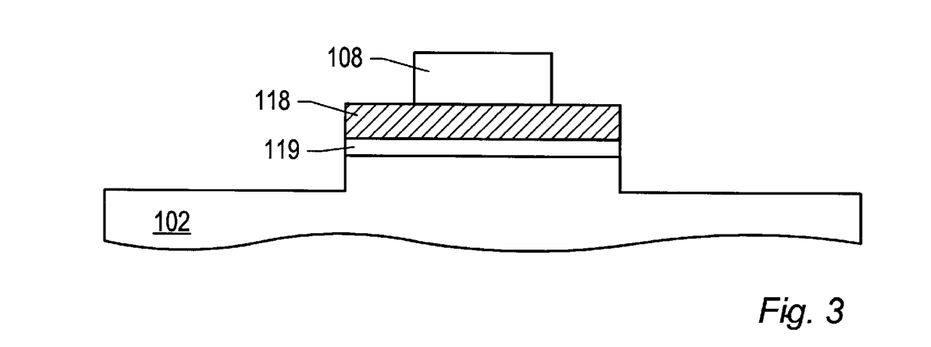
FIG. 3 is a processing step subsequent to FIG. 2, in which a lateral width of the masking structure is reduced.

FIG. 3, illustrates a processing step in which a lateral width of masking structure 108 is preferably reduced. The masking structure is preferably subjected to an isotropic etch in which horizontal and vertical surfaces of masking structure 108 are removed at substantially the same rate. In this manner, both the height and lateral width of the masking structure may be reduced. The etch is terminated after a select lateral amount of masking structure 108 is removed.

Figure 4:
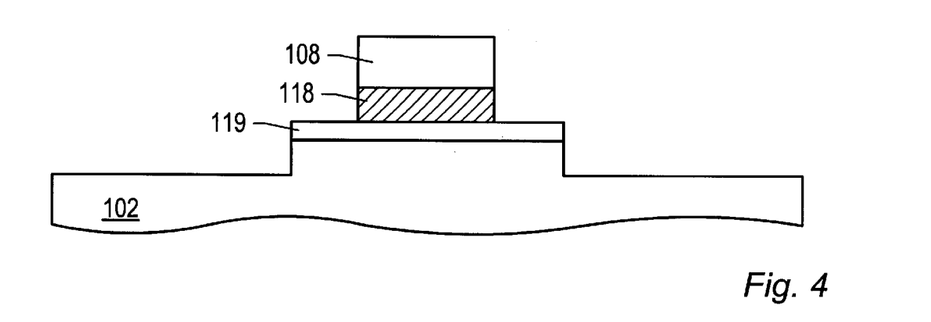
FIG. 4 is a processing step subsequent to FIG. 3, in which a lateral width of the gate conductor is reduced.

The reduced-width masking structure 108 may then be used as a mask to further reduce the width of gate conductor 118, as depicted in FIG. 4. An anisotropic etch in which ion ablation of the polysilicon occurs at a faster rate in a vertical direction than in a horizontal direction may be used. A plasma may be generated from a gas bearing fluorine- and chlorine-containing molecules (e.g., $SF_6$ and $Cl_2$) to provide for an anisotropic etch which is highly selective to the gate conductor material (e.g., polysilicon). Gate conductor 118 is preferably etched down to the gate dielectric 119. Etching conditions are preferably chosen such that gate dielectric 104 remains substantially unetched after etching of gate conductor 118 is completed. As a result of this etching process the lateral width of gate conductor 118 is preferably reduced.

The reduction of the lateral width of the gate conductor allows the formation of a transistor having a channel length which may be less than the optical resolution of the photolithographic equipment. For example, if the masking structure is initially formed at the optical resolution limit of the photolithographic equipment, the subsequent reduction of the width of the masking structure preferably allows the gate conductor to be etched to a width below the optical resolution of the photolithographic equipment. An advantage of this process is that the density of transistors in an integrated circuit may be increased by using these reduced-width transistors. Another advantage is that the gate conductor may be substantially centered upon the mesa, thus avoiding alignment problems which may occur if the gate conductor is formed after formation of the mesa.

Figure 5:
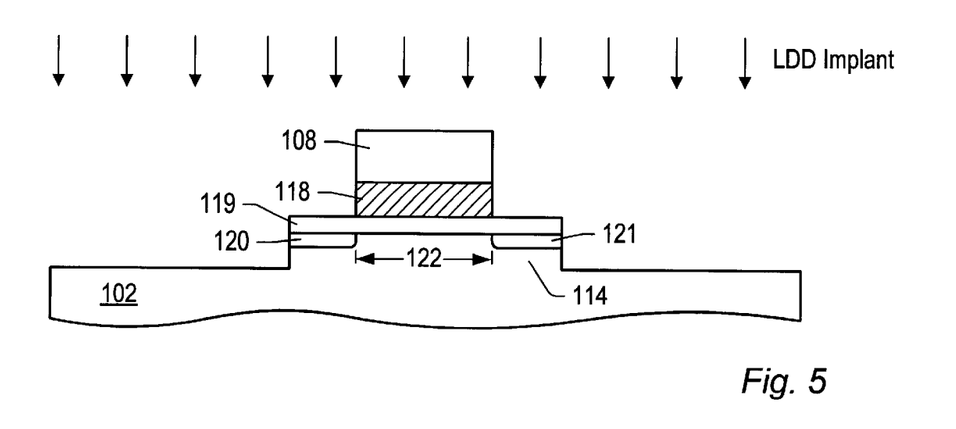
FIG. 5 is a processing step subsequent to FIG. 4, in which LDD areas are formed within the mesa adjacent to the gate conductor.

FIG. 5 illustrates implantation of a first dopant distribution into mesa 114. The implantation of a first dopant distribution preferably forms LDD areas 120 and 121. Gate conductor 118 and masking structure 108 serve to mask the implant from channel region 122. If a PMOS integrated circuit is being formed, ion implantation of p-type impurities is preferably performed. If an NMOS integrated circuit is being formed, ion implantation of n-type impurities is preferably performed. The LDD areas are preferably aligned with the sidewalls of gate conductor 118 and extend to a sidewall of the mesa. In this manner, the LDD area may be contained within the mesa without the use of further masking steps or isolation structures. The length of the mesa, and therefore the LDD areas subsequently formed therein, may be controlled by forming a mesa having a predetermined width during the photolithographic masking step. The control of the length of the LDD areas may help to reduce short channel effects.

Figure 6:
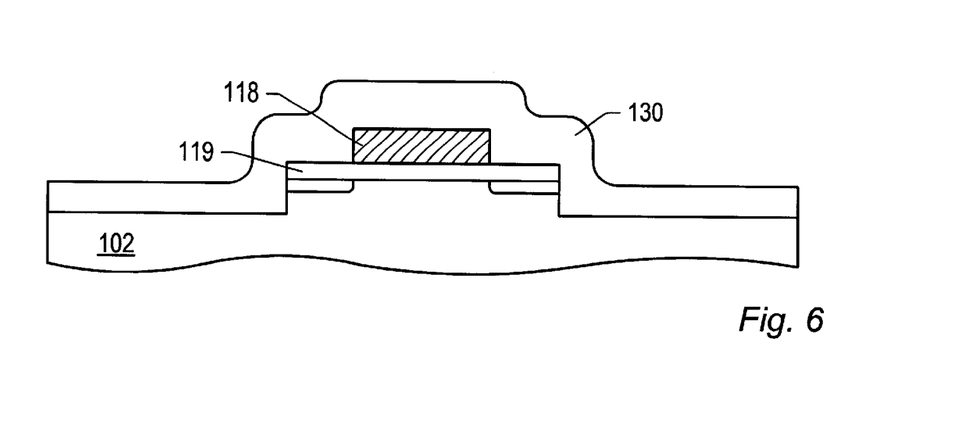
FIG. 6 is a processing step subsequent to FIG. 5, in which a conformal spacer layer is deposited over the semiconductor substrate.
Figure 7:
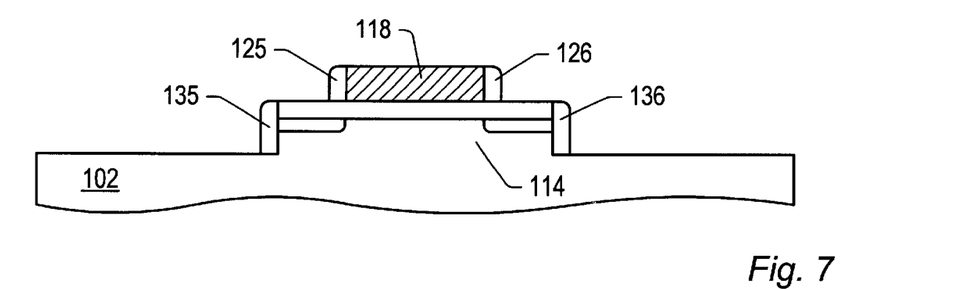
FIG. 7 is a processing step subsequent to FIG. 6, in which spacers are formed on sidewalls of the gate conductor.

FIG. 6 illustrates the deposition of spacer material 130. After removal of masking structure 108, spacer material 130 is preferably deposited across the entire semiconductor topography to form a conformal layer. Spacer material 130 may comprise silicon oxide or nitride deposited from a CVD apparatus. After deposition, spacer material 130 undergoes an anisotropic etch. This causes substantially horizontal surfaces to be removed faster than substantially vertical surfaces. Accordingly, anisotropic etching removes a portions of spacer material 130. Preferably, those portions existing over horizontal surfaces of gate conductor 118, gate dielectric 119 and semiconductor substrate 102 are removed. The only regions of spacer material 130 which remain are those regions near substantially vertical surfaces, as depicted in FIG. 7. Spacers 125 and 126 are preferably formed on the sidewalls of gate conductor 118. Additional spacers 135 and 136 are preferably formed on the sidewalls of mesa 114.

Figure 8:
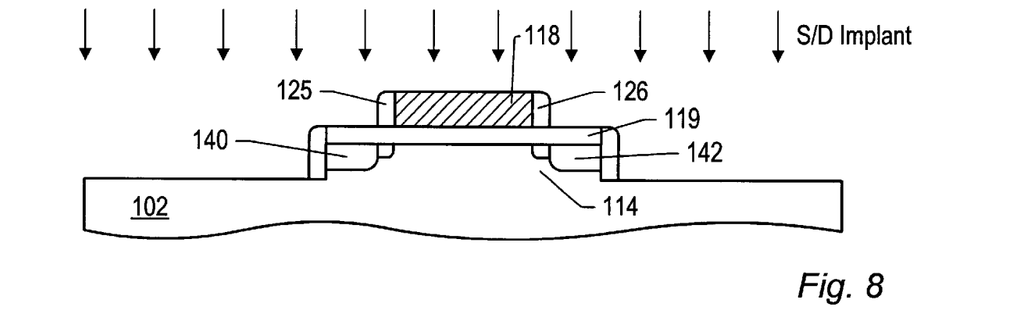
FIG. 8 is a processing step subsequent to FIG. 7, in which source/drain regions are formed within the mesa.

FIG. 8 illustrates the formation of source/drain implants 140 and 142 within mesa 114. Gate conductor 118 and spacers 125 and 126 preferably serve to mask the source/drain implant from channel region 122 and a portion of the LDD areas under the spacers. The source/drain implant is preferably of the same dopant species as the LDD implant, albeit at a higher concentration and energy than the LDD implants. Resulting from the source drain implant, source/drain regions 142 and 140 are produced. The spacers 125 and 126 serve to preferably align the source/drain regions 140 and 142 a spaced distance from the gate conductor 118. The source/drain regions preferably extend to a sidewall of mesa 114. The source/drain regions preferably extend to a depth which is above the upper surface of the silicon substrate. Thus, the source/drain regions are preferably contained within mesa 114.

Figure 9:
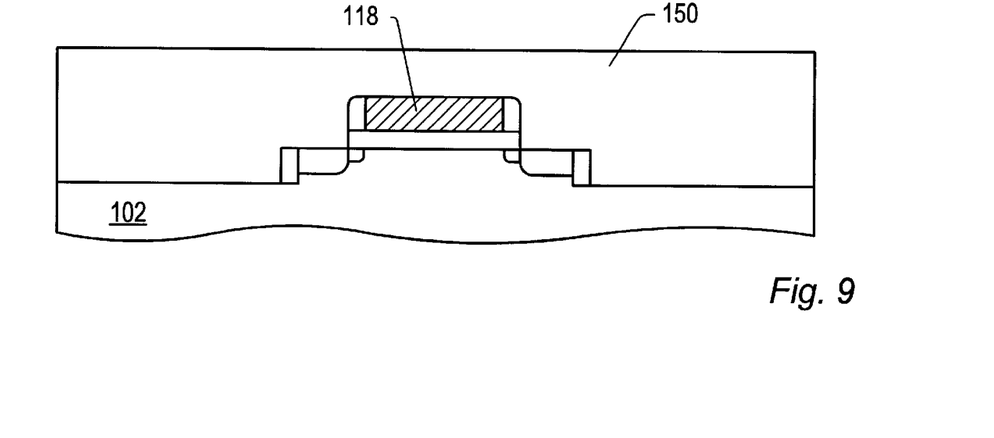
FIG. 9 is a processing step subsequent to FIG. 8, in which a dielectric layer is formed over the semiconductor substrate.

FIG. 9 depicts the formation of a dielectric layer 150 over the semiconductor substrate. Dielectric layer 150 is preferably deposited by a CVD apparatus. The deposition is continued such that the lowest portion of the dielectric layer is substantially above the upper surface of gate conductor 118. Preferably, the upper surface of dielectric layer 150 is polished such that a substantially planar dielectric layer is produced. The formed dielectric layer may serve to isolate transistors from each other. Thus, a series of transistors may be formed and isolated from each other without the use of standard isolation techniques (e.g., LOCOS or trench isolation). Since most standard isolation techniques require consumption of significant amounts of the semiconductor substrate, the use of the above described method may allow more of the semiconductor substrate to be used for transistor formation. Additionally, since the use of isolation structures typically requires additional processing steps, the present method may allow a more efficient production of integrated circuits. Finally, the dielectric layer may be used to vertically separate the different levels of an integrated circuit.

Figure 10:
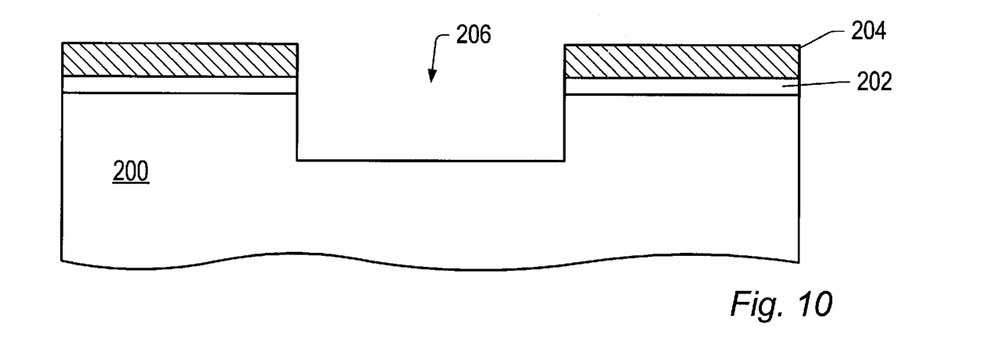
FIG. 10 is a partial cross-sectional view of a semiconductor substrate upon which a nitride layer and a pad oxide layer are formed, and wherein a portions of the nitride layer, the oxide layer, and the semiconductor substrate are removed to form a trench.

FIGS. 10–21 illustrate a sequence of semiconductor fabrication steps according to another embodiment of the present invention. Turning to FIG. 10, a partial cross-sectional view of a semiconductor substrate 200 is depicted. Substrate 200 preferably comprises single crystalline silicon which has been slightly doped with n-type or p-type impurities. Although not shown, dielectric isolation regions (i.e., field regions) may be arranged spaced distances apart within substrate 200 to dielectrically isolate ensuing active areas. In an alternate embodiment, p-type and n-type wells may be arranged within select regions of substrate 200 to allow for the formation of a CMOS integrated circuit which includes both NMOSFET and PMOSFET transistors. A pad oxide layer 202 is formed across semiconductor substrate 200 using, e.g., LPCVD from a TEOS (tetraethyl-orthosilicate) source. A nitride layer 204 is then LPCVD deposited across pad oxide layer 202 from, e.g., a silane- and ammonia-bearing source. Pad oxide layer 202 preferably serves to reduce the inherent stresses which normally exist between nitride and silicon. Nitride layer 204 in combination with pad oxide layer 202 may serve as a masking layer during subsequent ion processing steps.

After formation of the masking layer, portions of nitride layer 204, pad oxide layer 202, and substrate 200 are preferably etched to form a trench 206 within substrate 200. Lithography is preferably used to pattern a photoresist mask across nitride layer 204, exclusive of the region to be etched. The etch technique is preferably a dry, plasma etch in which the etch duration is selected to terminate after a pre-defined thickness of the substrate has been removed. Opposed sidewalls of trench 206 are aligned with opposed lateral boundaries of nitride layer 204.

Figure 11:
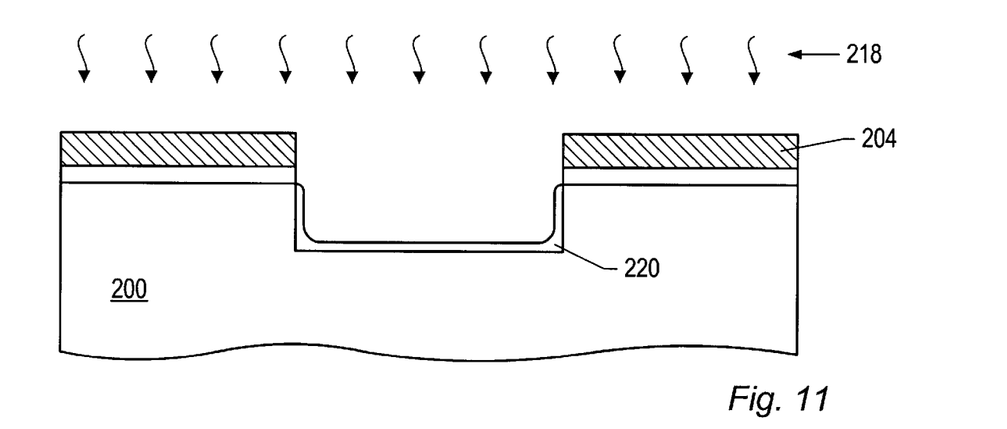
FIG. 11 is a processing step subsequent to FIG. 10, in which a gate dielectric layer is thermally grown upon the silicon-based surfaces bordering the trench.

FIG. 11 illustrates a gate dielectric 220 being formed upon the silicon-based surfaces arranged about the perimeter of trench 206. Those silicon-based surfaces may be oxidized by subjecting substrate 200 to thermal radiation 218 in an oxygen-bearing ambient. While gate dielectric 220 is preferably a thermally grown oxide, it may also be composed of other dielectric materials. For example, high frequency operation of the ensuing transistor may be achieved if gate dielectric 220 is composed of a dielectric having a dielectric constant greater than that of oxide, e.g., nitride. Nitride layer 204 substantially inhibits ambient oxygen from penetrating to and oxidizing underlying regions of substrate 200. As such, nitride layer 204 may be substituted with any material which may act as an oxygen barrier.

Figure 12:
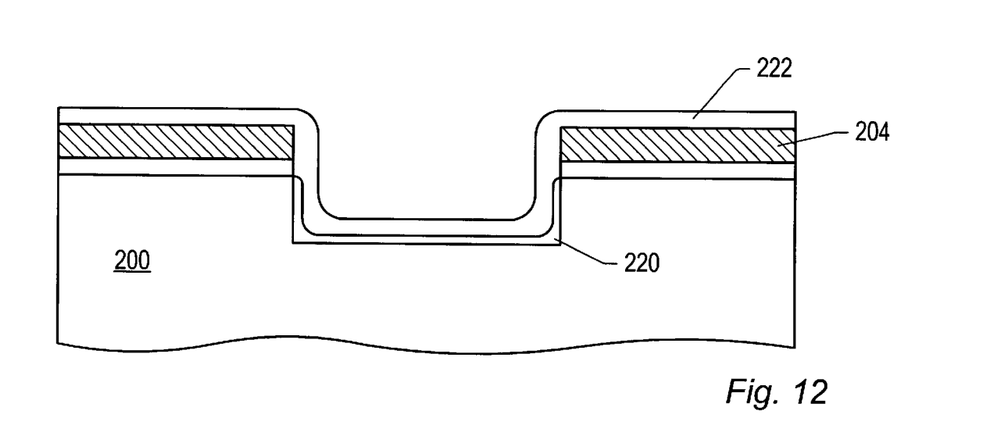
FIG. 12 is a processing step subsequent to FIG. 11, in which a conformal dielectric layer is deposited across exposed surfaces of the masking layer and the gate dielectric to form spacers within the trench.

FIG. 12 depicts the deposition of a dielectric layer 222 across nitride layer 204 and gate dielectric 220. Dielectric layer 222 may, e.g., be LPCVD deposited from a TEOS source. Dielectric layer 222 is not limited to TEOS and may also be composed of other dielectrics which are substantially dissimilar to nitride layer 204. The duration of the deposition may be varied to control the thickness of the dielectric layer, and hence the lateral thickness of the sidewall spacers formed from the dielectric layer. By varying the thickness of the spacer walls the length of the subsequently formed gate conductor may be varied. The reduction of the lateral width of the gate conductor allows the formation of a transistor having a channel length which may be less than the optical resolution of the photolithographic equipment.

Figure 13:
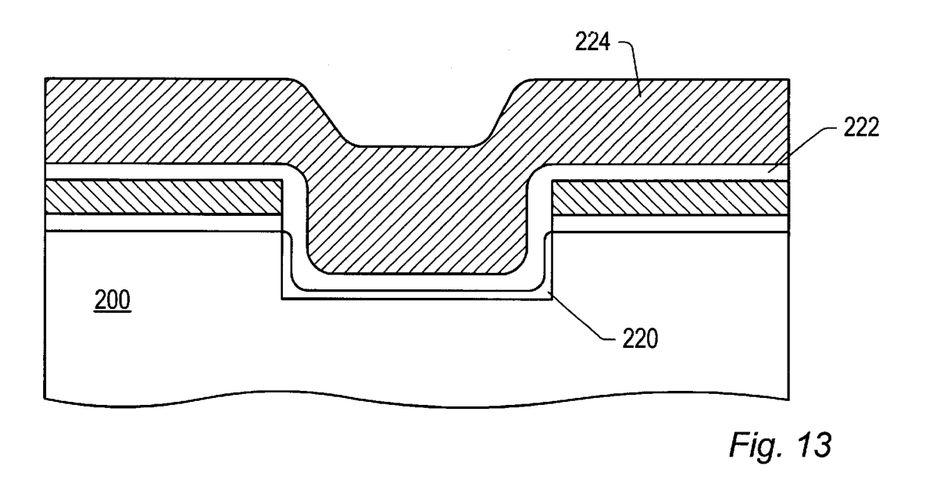
FIG. 13 is a processing step subsequent to FIG. 12, in which a gate conductor material is deposited across the dielectric layer to a level spaced above the upper surface of the masking layer.

As shown in FIG. 13, a gate conductor material 224 is preferably deposited across dielectric layer 222 to a level spaced above the upper surface of dielectric layer 222. Gate conductor material 224 is preferably composed of polysilicon and thus may be PECVD deposited from, e.g., a silane source. The polysilicon may be rendered conductive by implanting impurities into the polysilicon during later processing steps.

Figure 14:
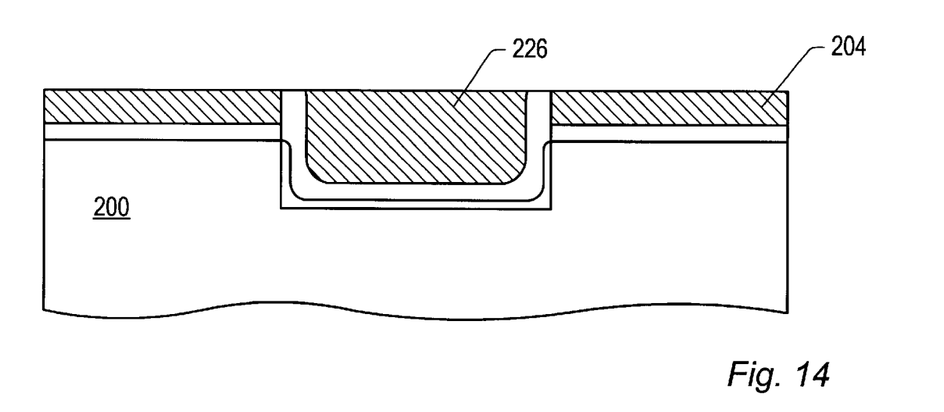
FIG. 14 is a processing step subsequent to FIG. 13, in which the gate conductor material and portions of the dielectric layer are removed down to a level approximately coplanar with an upper surface of the masking layer to form a gate conductor within the trench.

Thereafter, the upper surface of gate conductor material 224 is removed to a level approximately commensurate with the upper surface of masking layer 204, as depicted in FIG. 14. Dielectric layer 222 may also be removed from the upper surface of masking layer 204. The removal of portions of gate conductor material 224 and dielectric layer 222 may be accomplished using CMP or sacrificial etchback such that the overall surface of the topography is substantially planarized. In this manner, a gate conductor 226 which is partially recessed below the uppermost surface of substrate 200 is formed between a pair of opposed sidewall surfaces. Those portions of dielectric layer 222 extending laterally between the opposed lateral boundaries of nitride layer 204 and the opposed sidewall surfaces of gate conductor 226 form sidewall spacers adjacent the upper portion of gate conductor 226.

Figure 15:
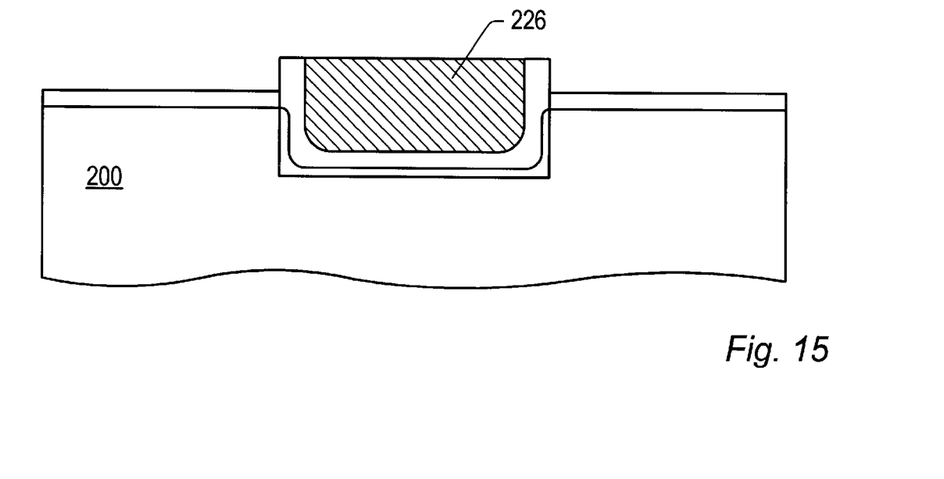
FIG. 15 is a processing step subsequent to FIG. 14, in which the nitride portion of the masking layer is removed.

FIG. 15 illustrates removal of nitride layer 204. Preferably, removal is achieved by a dry etch process, e.g., a plasma etch. The process conditions are chosen such that the nitride layer is removed with high selectivity against removal of the underlying oxide layer. A plasma etch process using a $NF_3$ plasma is preferred.

Figure 16:
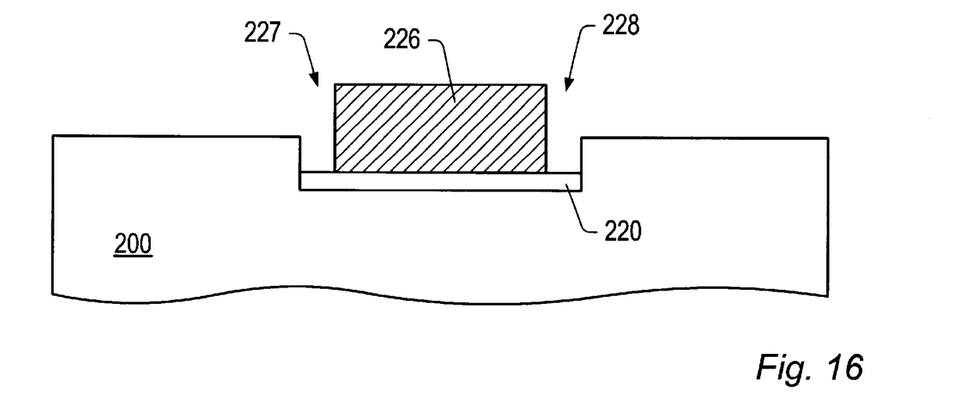
FIG. 16 is a processing step subsequent to FIG. 15, in which the dielectric sidewall spacers are selectively etched to a level coplanar with a lower surface of the gate conductor.

Turning to FIG. 16, the sidewall spacers, which are composed of portions of dielectric layer 222 and gate dielectric 220, are selectively etched to a level approximately coplanar with the lower surface of gate conductor 226. An anisotropic etch (e.g., a plasma etch) or an isotropic etch (e.g., wet etch chemistry) which exhibits a high selectivity for the dielectric layer material relative to the gate conductor material and to semiconductor substrate 200 may be employed to remove the sidewall spacers. Etching of the sidewall spacers preferably concurrently removes portions of dielectric layer 222 over semiconductor substrate 200. Removal of portions of the sidewall spacers preferably forms a pair of openings 227 and 228 between semiconductor substrate 200 and gate conductor 226 such that the lateral boundaries of semiconductor substrate 200 and the opposed sidewall surfaces of gate conductor 226 are exposed.

After the sidewall spacers have been reduced, the semiconductor substrate may be etched by an anisotropic etch, e.g., a plasma etch. Etching of the semiconductor substrate is preferably performed to reduce the distance between the upper surface of the silicon substrate and the lower surface of the gate conductor. In subsequent steps the source/drain implants will be forwarded into the semiconductor substrate. During typical transistor formation the source/drain regions are preferably forwarded to a level substantially below a lower surface of the gate conductor. If the distance between the upper surface of the silicon substrate and the lower surface of the gate conductor is large, the implantation and subsequent anneal used to form the source/drain regions may be performed at conditions which may cause unwanted diffusion of impurities into the channel region. By lowering the height of the semiconductor substrate the source/drain implants may be formed under conditions which preferably minimize diffusion of impurities into the channel region.

Figure 17:
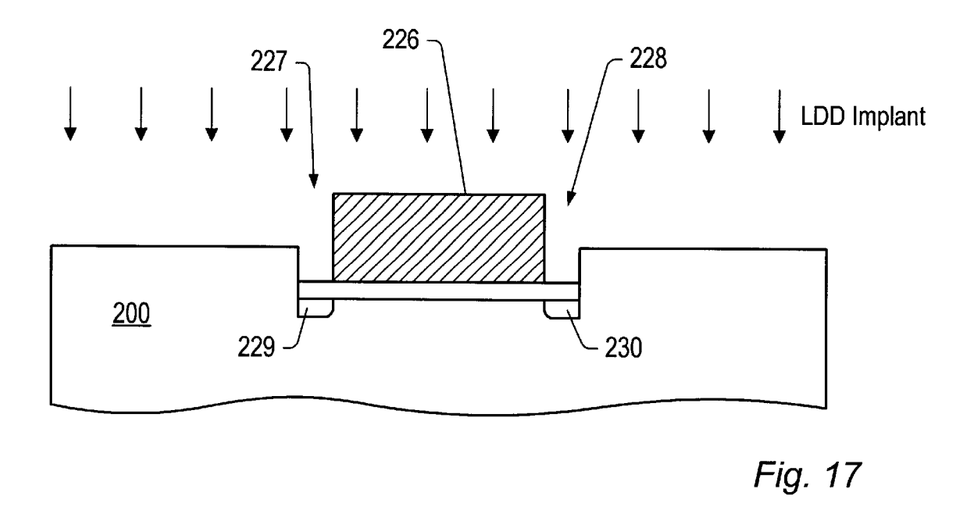
FIG. 17 is a processing step subsequent to FIG. 16, in which a lightly doped drain implant is formed within the semiconductor substrate such that the implant is self-aligned between the sidewall surfaces of the gate conductor and the lateral boundaries of the masking layer.

As shown in FIG. 17, an LDD implant is performed at a relatively low dose to implant dopant species opposite in type to those within substrate 200 into LDD areas 229 and 230. The LDD implant is self-aligned between the lateral boundaries of semiconductor substrate 200 and the opposed sidewall surfaces of gate conductor 226. The implant energy is sufficiently large to drive the dopant species to LDD areas 229 and 230 underneath the base of the trench formed within substrate 200. As such, each LDD area 229 and 230 is self-aligned with, and has substantially the same lateral width as, the respective openings 227 and 228 positioned directly above that LDD area.

The process steps described above may allow the lateral width of each LDD area to be significantly adjusted by adjusting the deposition time of the dielectric sidewall spacers (i.e., dielectric layer 222). As the deposition time is adjusted the lateral width of the sidewall spacers is also adjusted. For example by decreasing the deposition time of the dielectric layer, the lateral width of the spacers may be reduced. After removal of the spacers, LDD areas may be formed having similarly reduced lateral widths. Reducing the lateral width of the LDD areas affords lower resistance to the flow of current (i.e., drive current) between the source and drain junctions of the ensuing transistor.

Figure 18:
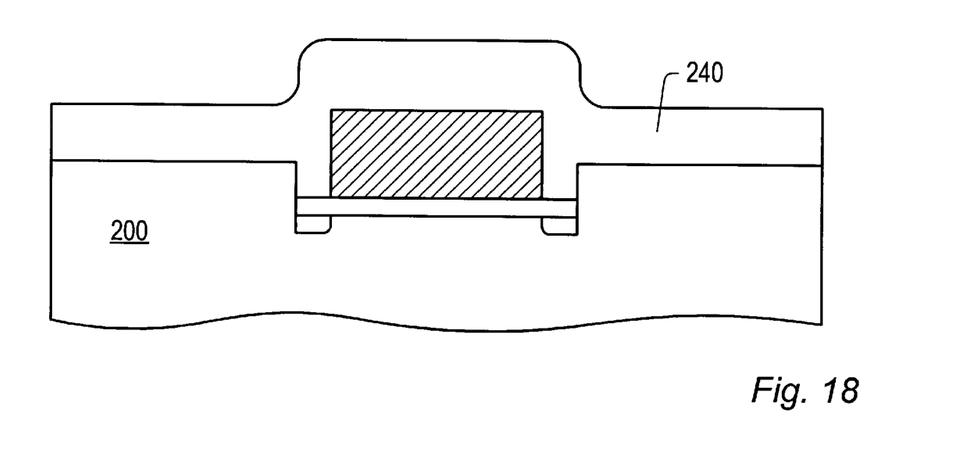
FIG. 18 is a processing step subsequent to FIG. 17, in which the masking layer is removed and a conformal spacer layer is deposited across exposed surfaces of the semiconductor substrate and the gate conductor.
Figure 19:
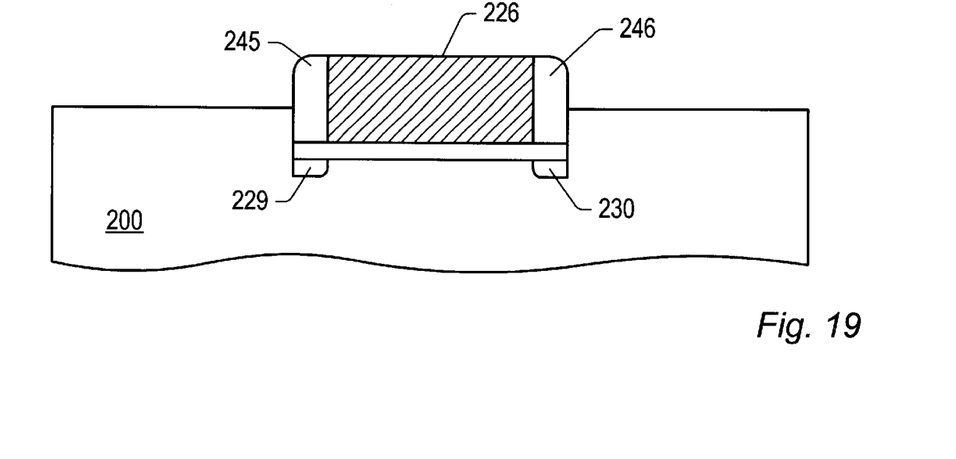
FIG. 19 is a processing step subsequent to FIG. 18, in which the conformal spacer layer is etched to form spacer structures of sidewall surfaces of the gate conductor.

FIG. 18 illustrates the deposition of spacer material 240. Spacer material 240 is preferably deposited across the entire semiconductor topography to form a conformal layer. Spacer material 240 may be composed of silicon oxide or nitride or oxynitride deposited from a CVD apparatus. After deposition, spacer material 240 undergoes an anisotropic etch. This causes substantially horizontal surfaces to be removed faster than substantially vertical surfaces. Accordingly, anisotropic etching removes portions of spacer material 240. Preferably, those portions existing over horizontal surfaces of gate conductor 226 and semiconductor substrate 200 are removed. The only regions of spacer material 240 which remain are those regions near substantially vertical surfaces, as depicted in FIG. 19. Spacers 245 and 246 are formed on the sidewalls of gate conductor 226.

Figure 20:
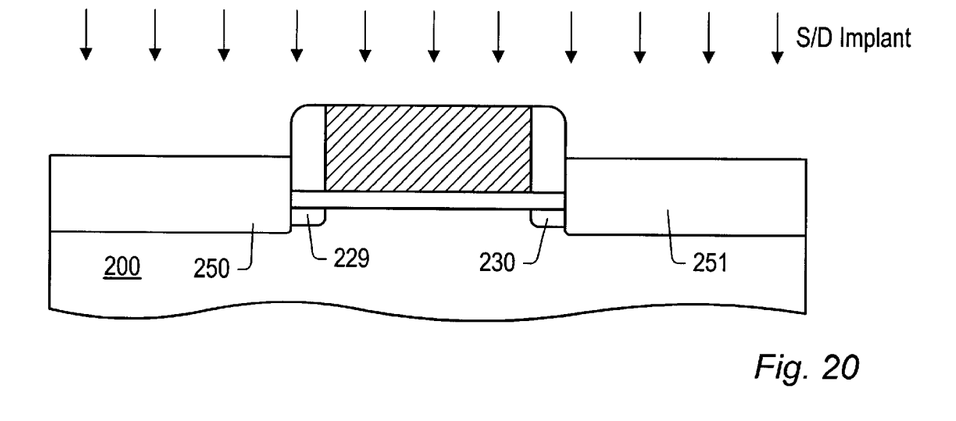
FIG. 20 is a processing step subsequent to FIG. 19, in which a source/drain implant is formed in the semiconductor substrate.

Turning to FIG. 20, source/drain dopants may then be implanted at a relatively high dose and energy into regions of substrate 200 not masked by spacer 245, spacer 246, and gate conductor 226 to form source and drain regions 250 and 251 laterally adjacent to the sidewalls of the trench in which gate conductor 226 partially resides. If a PMOS integrated circuit is being fabricated, p-type dopant species are implanted, and if an NMOS integrated circuit is being formed, n-type dopant species are implanted. Some commonly used n-type species are arsenic or phosphorus, and some commonly used p-type species are boron or boron difluoride. The resulting transistor comprising source and drain regions 250 and 251 and gate conductor 226 includes a channel within substrate 200 between LDD areas 229 and 230. A post-implant anneal may be performed to activate and position the as-implanted impurities.

The gate conductor combined with the sidewall spacers formed on opposite sides of the gate conductor serve as a mask during the implantation of dopant species into source and drain regions of the substrate. The dopant species are implanted to a depth spaced below the base of the trench within which the gate conductor is formed. The resulting doped source and drain regions have a relatively shallow "effective" depth extending below the base of the trench. The reduced effective depth of the source and drain regions permits the Leff of the transistor to be scaled down without experiencing severe and detrimental short channel effects. Further, the actual depth of the source and drain regions is sufficiently large to substantially prevent junction spiking during the subsequent formation of silicide contact areas upon the source and drain regions. The source and drain regions also exhibit low resistance, and thus provide for adequate drive current, $I_D$, between the source and drain regions during operation of the transistor.

Figure 21:
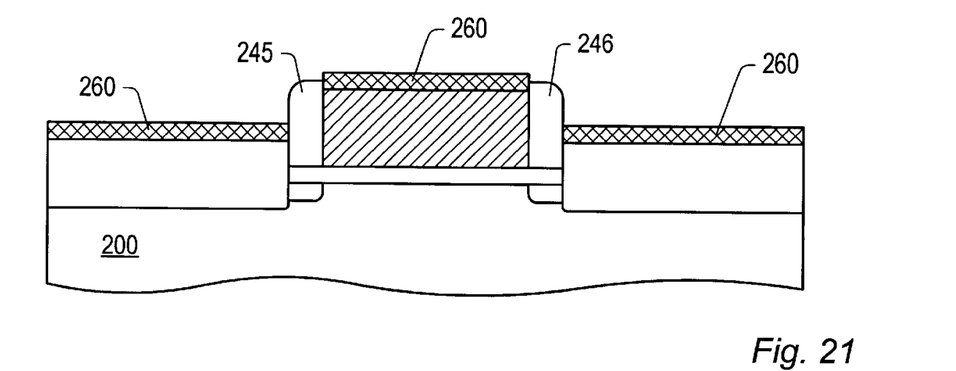
FIG. 21 is a processing step subsequent to FIG. 20, in which metal silicide is formed upon the source/drain regions and the upper surface of the gate conductor.

FIG. 21 illustrates the formation of silicide structures 260 (e.g., $TiSi_2$ or $CoSi_2$) upon the upper surfaces of gate conductor 226 and source and drain regions 250 and 251. A refractory metal, e.g., titanium or cobalt, is deposited across the semiconductor topography using either sputter deposition from a metal target or metal organic chemical vapor deposition ("MOCVD") from a gas comprising a metal organic-containing compound. Spacers 245 and 246 preferably inhibit the refractory metal from contacting the gate conductor. The refractory metal is then exposed to a form of radiation provided by either an annealing furnace or an RTA chamber. As a result of being subjected to a heat cycle, the refractory metal reacts with underlying silicon of semiconductor substrate 200 and polysilicon gate conductor 226 to form metal silicide structures 260. Unreacted portions of the refractory metal are then removed using an etch technique which is highly selective to the metal.

It will be appreciated to those skilled in the art having the benefit of this disclosure that the invention is capable of applications with numerous types of MOS-processed circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claim be interpreted to embrace all such modifications and changes and, accordingly the specification and drawings are to be regarded in an illustrative rather than a restrictive sense.

What is claimed is:

1. A transistor comprising:
   a gate dielectric arranged on a base of a trench, the trench having substantially vertical sidewalls and arranged within a semiconductor substrate, wherein the gate dielectric extends laterally to the vertical trench sidewalls;
   a gate conductor arranged on an upper surface of the gate dielectric, wherein the gate conductor does not extend laterally to the vertical trench sidewalls, wherein an uppermost surface of the gate dielectric and a lower surface of the gate conductor are substantially below an upper surface of the semiconductor substrate, and wherein an upper surface of the gate conductor is substantially above the upper surface of the semiconductor substrate; and
   junction regions formed adjacent to the gate conductor.

2. The transistor of claim 1, wherein the gate dielectric comprises thermally grown silicon dioxide.

3. The transistor of claim 1, wherein the semiconductor substrate comprises single crystalline silicon.

4. The transistor of claim 1, wherein the gate conductor comprises doped polysilicon.

5. The transistor of claim 1, further comprising silicide layers arranged upon an upper surface of the gate conductor and a portion of the junction regions.

6. The transistor of claim 1, wherein the gate conductor has a substantially rectangular cross-section.

7. The transistor of claim 1, further comprising spacer structures extending laterally from sidewall surfaces of the gate conductor.

8. The transistor of claim 7, wherein the junction regions comprise:
   a pair of lightly doped drain areas residing within the semiconductor substrate exclusively, in a region directly below the spacer structures; and
   source/drain regions residing within the semiconductor substrate laterally adjacent to the lightly doped drain areas, wherein the source/drain regions extend from the upper surface of the semiconductor substrate to a position substantially below a lower depth of the lightly doped drain areas.

* * * * *